(12) United States Patent
Olsen

(10) Patent No.: US 8,963,018 B2
(45) Date of Patent: Feb. 24, 2015

(54) PRINTED CIRCUIT BOARD

(75) Inventor: Conny Olsen, Segeltorp (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 195 days.

(21) Appl. No.: 13/501,954

(22) PCT Filed: Jan. 28, 2010

(86) PCT No.: PCT/SE2010/050088
§ 371 (c)(1),
(2), (4) Date: Apr. 13, 2012

(87) PCT Pub. No.: WO2011/046484
PCT Pub. Date: Apr. 21, 2011

(65) Prior Publication Data
US 2012/0199380 A1    Aug. 9, 2012

Related U.S. Application Data

(60) Provisional application No. 61/252,407, filed on Oct. 16, 2009.

(51) Int. Cl.
*H05K 1/11* (2006.01)
*H05K 1/02* (2006.01)

(52) U.S. Cl.
CPC .............. *H05K 1/112* (2013.01); *H05K 1/025* (2013.01); *H05K 1/0224* (2013.01); *H05K 2201/09236* (2013.01); *H05K 2201/09381* (2013.01)
USPC .......................................... 174/262; 361/774

(58) Field of Classification Search
CPC ............................. H05K 1/115; H05K 1/116
USPC ................... 361/774, 792–795; 174/262–266
See application file for complete search history.

(56) References Cited

U.S. PATENT DOCUMENTS

| 6,803,527 | B2 * | 10/2004 | Dishongh et al. | ............. | 174/260 |
| 7,045,719 | B1 * | 5/2006 | Alexander et al. | ............. | 174/262 |
| 2003/0183420 | A1 | 10/2003 | Dishongh et al. | | |

FOREIGN PATENT DOCUMENTS

| CN | 1110496 A | 10/1995 |
| JP | A-2008-141036 A | 6/2008 |
| WO | WO9423554 A1 | 10/1994 |

* cited by examiner

*Primary Examiner* — Jeremy C Norris

(57) ABSTRACT

The present invention concerns a printed circuit board, PCB. The PCB comprises a number of signal layers comprising routing channels and at least one ground layer being adjacent to at least one signal layer. A number of via holes connects different signal layers of the PCB. In the signal layers the via holes are connected to pads and in the ground layers they are be surrounded by anti-pads. The pads are shaped such that at least a part of a via hole connected to the pad is on the outside of, or in close proximity to, the edge of the pad, irrespective of where on the pad the centre of the via hole is positioned.

13 Claims, 10 Drawing Sheets

PRINTED CIRCUIT BOARD

TECHNICAL FIELD

The present invention relates to a multi-layered printed circuit board, having via holes connecting different layers.

BACKGROUND

A printed circuit board (PCB) is a board of laminated insulator material with routing channels, also called conductive traces, on the surface. The routing channels interconnect the components (for example, transistors, diodes, resistors, LEDs, connectors, etc) that are placed on the surface(s) of the PCB. The main body of the PCB is made up of different layers laminated together. The laminate material is an electrical insulator and can be made of e.g. epoxy and fiberglass. The electrical connections in the PCB are practically always made up of copper, e.g. the routing channels are made up strips of copper, called micro strips on the outer layers and strip lines in the inner layers, connecting different components. A layer of the PCB that contains routing channels is called a conductive layer. A PCB can have a plurality of conductive layers, wherein the routing channels of the inner conductive layers are buried inside the insulator. In between different conductive layers, a ground layer, which is a layer that is entirely at ground potential, may be arranged.

In order to connect different conductive layers of a PCB so called via holes are arranged in the PCB. Via holes are conductively plated on their interior surface and routing channels on the conductive layers may be connected to the via holes through a so called pad surrounding the via hole. Via holes can protrude all the way through a PCB or they can be buried, which means that the via holes interconnects internal layers and cannot be seen from the exterior of the PCB. Via holes can also be blind, which means that they can be seen from one side of the PCB. When fabricating multilayer PCBs having a plurality of conductive layers, often the pads in different layers are connected using a special copper plating process commonly referred to as a plated through hole (PTH). PTHs allow interconnectivity between layers on via holes and are produced/drilled after the different layers of the PCB are pressed together. In ground layers the PTHs are surrounded by so called anti-pads, which basically is copper that has been etched away around a via or a PTH on a ground plane and thereby prevents electrical connection to the plane from the via or PTH.

PCB's usually have a foot-print for press-fit or soldered connectors that have a predefined hole pattern. Pads that surround PTHs have a specified diameter to handle production tolerances and also ensure connection to the inner layers in the PCB. The pads have a minimum diameter depending on the drilled diameter of the PTH, which is specified depending on the connector type. Circular pads are normally used for plated through holes in PCBs. Each connector type has a unique connector foot-print consisting of PTHs in the PCB for the signal pins and the ground pins.

In the (near) future products will be based on high speed technologies for bit rates above 10 Gb/s single lane. For a successful transmission link all interconnection elements require optimized electrical performance. A transmission link may comprise transceivers, connectors and PCBs. The layout of current PCBs is adding discontinuities which are reducing the signal quality. PTHs, impedance mismatch of transmission lines, bends on routing channels, ground return coverage in adjacent layers, crosstalk, etc., are some factors that reduce the signal quality.

SUMMARY

An object of the present invention is therefore to provide a printed circuit board with a design that eases the signal transmission through a PCB.

According to an embodiment of the present invention a printed circuit board (PCB) is provided. The PCB comprises a number of signal layers comprising routing channels and at least one ground layer being adjacent to at least one signal layer. A number of via holes connects different signal layers of the PCB. In the signal layers the via holes are connected to pads and in the ground layers they are surrounded by anti-pads. One or more pads are shaped such that at least a part of a via hole connected to the pad is on the outside of, or in close proximity to, the edge of the pad, irrespective of where on the pad the centre of the via hole is positioned. Preferably, the centre of the via hole is positioned within a manufacturing tolerance. The wording "close proximity to" should be understood to mean that the distance between the pad and the edge of the pad is approximately less than 10% of the via hole diameter.

An advantage with such a layout of the PCB is that a signal can be easily transmitted between different signal layers of the PCB.

According to embodiments of the invention a PCB is provided wherein the pads are shaped such that the length of a first path, P1 is different from the length of a second path, P2. The first path, P1, stretching from the center of the pad and substantially in a direction in which the routing channel(s) extend, to a first point located on the edge of the pad, and the second path, P2, stretching from the center of the pad and substantially in a direction towards the routing channel(s) to a second point located on the edge of the pad. Preferably, the first path, P1, is longer than the second path, P2, and the second path is preferably approximately equal to, or slightly larger than, the radius of the via hole.

An advantage with such a design of the pad is that it allows large routing channels at the same time as a low capacitance between adjacent layers can be accomplished.

BRIEF DESCRIPTION OF THE DRAWINGS

Reference will now be made, by way of example, to the accompanying drawings, in which.

DETAILED DESCRIPTION

This section gives detailed description about embodiments of the present invention. FIGS. 1-6a should however only be seen as introductory since these figures describe previously known PCB designs.

The terms via hole and PTH are used interchangeably in the description. A PTH should however be seen as a via hole that protrude the entire PCB. The function of the invention is however not depending on whether the via hole is a PTH or a buried via.

Figure 1:
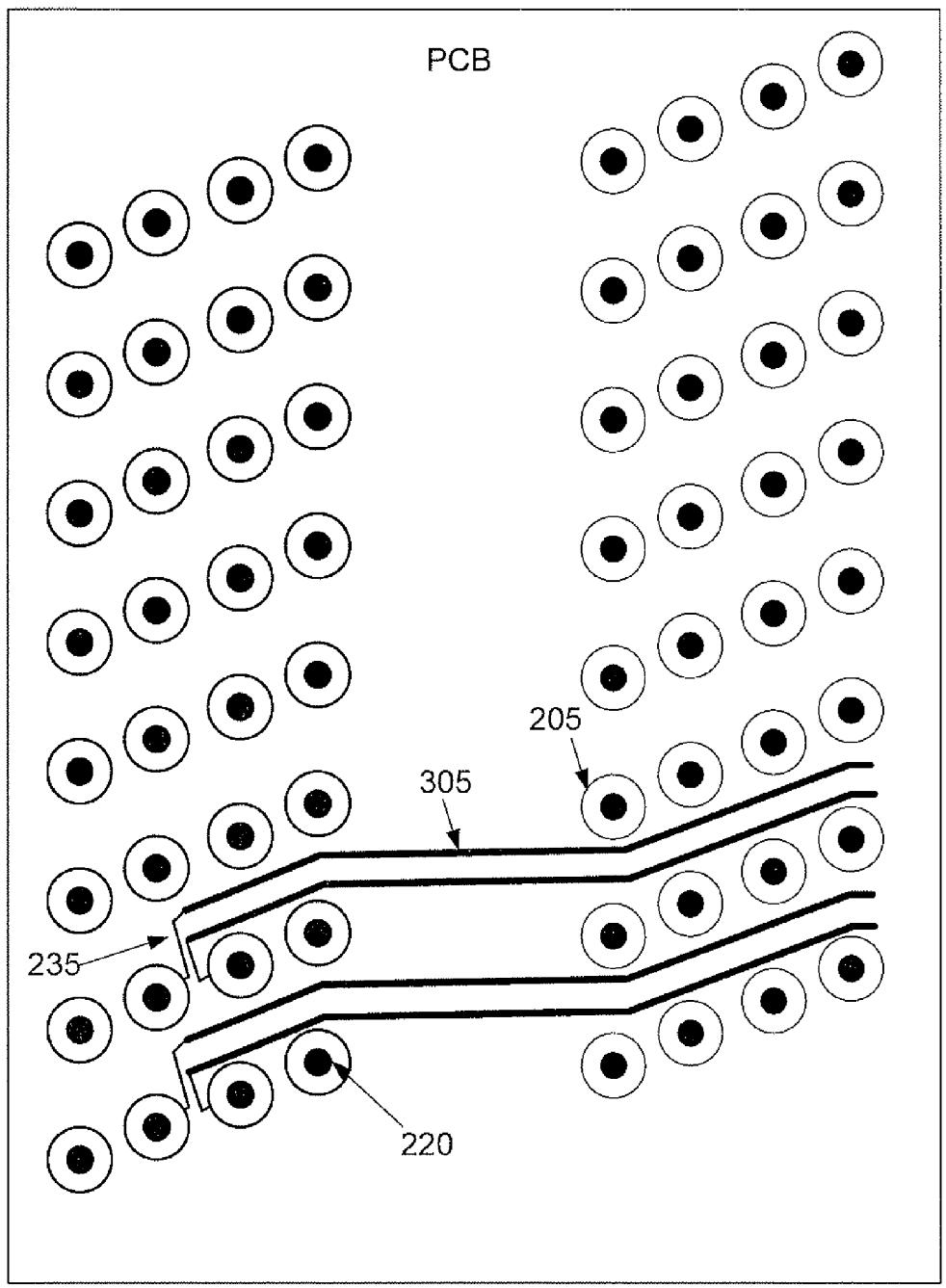
FIG. 1 illustrates an overview of a layer of a PCB according to the prior art.

FIG. 1 illustrates an overview of a layer of a PCB. Routing channels are arranged between rows of pads. Some of the pads are connected to routing channels and some are not. Via holes or PTHs are arranged in the pads.

Figure 2:
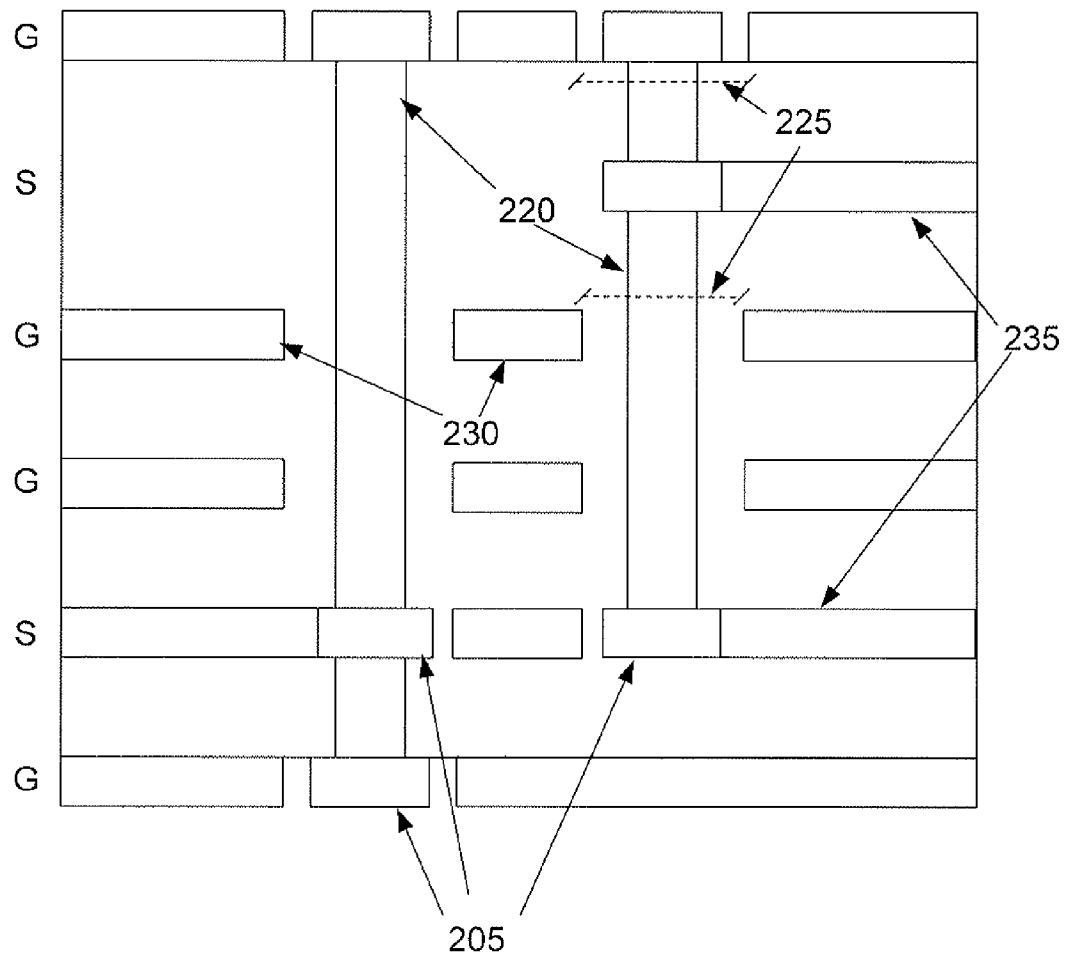
FIG. 2 schematically illustrates a cross section of a PCB comprising a plurality of layers according to the prior art.

FIG. 2 schematically illustrates a cross section of a PCB comprising a plurality of layers according to the prior art. As can be seen this PCB comprise six layers, two signal layers (also called conductive layers) comprising pads 205 surrounding via holes 220 and signal connections 235 to routing channels (not shown); and four ground layers, G, comprising areas of copper 230 (could of course also be made up of other metals) and anti-pads 225 separating the via holes 220 and the areas of copper 230. In an outer layer, a via hole may be connected to a pad, even though the outer layer is a ground layer.

Figure 3:
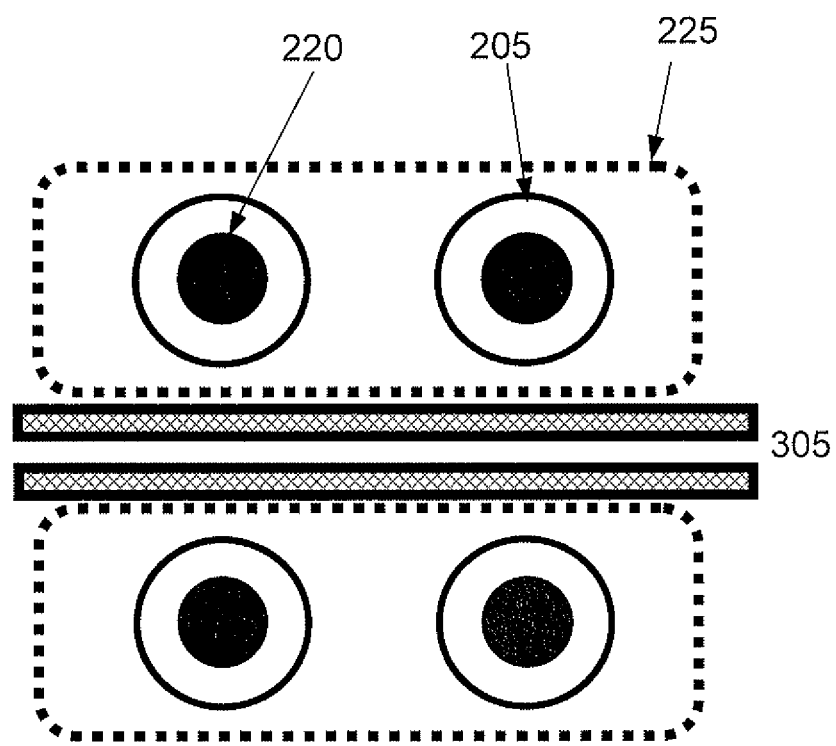
FIG. 3 schematically illustrates a part of a layer of a PCB according to the prior art showing four pads, each with a PTH, and a routing channel. Anti-pads in an adjacent layer are shown with dotted lines.

FIG. 3 schematically illustrates a part of a layer of a PCB, according to the prior art, showing four pads 205, each with a PTH 220, and a routing channel 305. Anti-pads 225 in an adjacent layer are shown with dotted lines.

Figure 4:
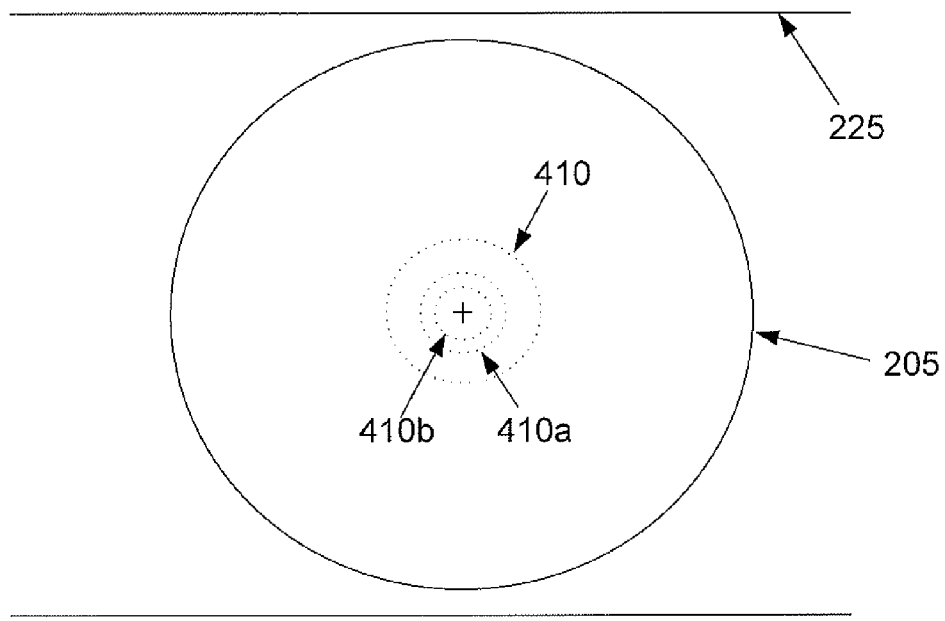
FIG. 4 schematically illustrates a known, circularly shaped pad.

FIG. 4 schematically illustrates a known, circularly shaped pad 205. Illustrated in the figure are also the edges of an anti-pad 225 in an adjacent ground layer. The total manufacturing tolerance 410 is illustrated with a dotted circle and includes in the following examples, tolerance for drill position 410a (the drill may not be positioned exactly where wanted) & layer misalignment 410b (different layers may be misaligned during production). It may also include a drilled hole radius tolerance, i.e. a tolerance for if the drilled hole gets larger diameter than the drill diameter. The diameter of a PTH 220 will in practice most often lie between a maximum drilled hole diameter and the diameter of the drill. The maximum drilled hole diameter thus being equal to the drill diameter plus the drilled hole diameter tolerance. The total manufacturing tolerance is related to the position of the pad 205 and means that the center of a via or a PTH should be within the circle showing the total manufacturing tolerance 410. Instead of defining the total manufacturing tolerance as the sum of drill position tolerance, layer misalignment tolerance and hole diameter tolerance/2; the total manufacturing tolerance may be defined as the sum of drill position tolerance and layer misalignment tolerance and with the hole diameter tolerance included in the predicted diameter of the PTH. In practice, the pad diameter is set to be approximately equal to the predicted diameter of the PTH plus the total manufacturing tolerance. The predicted diameter is equal to a nominal via diameter or the drill diameter. In the following the hole radius tolerance is included in the total manufacturing tolerance.

Figure 5:
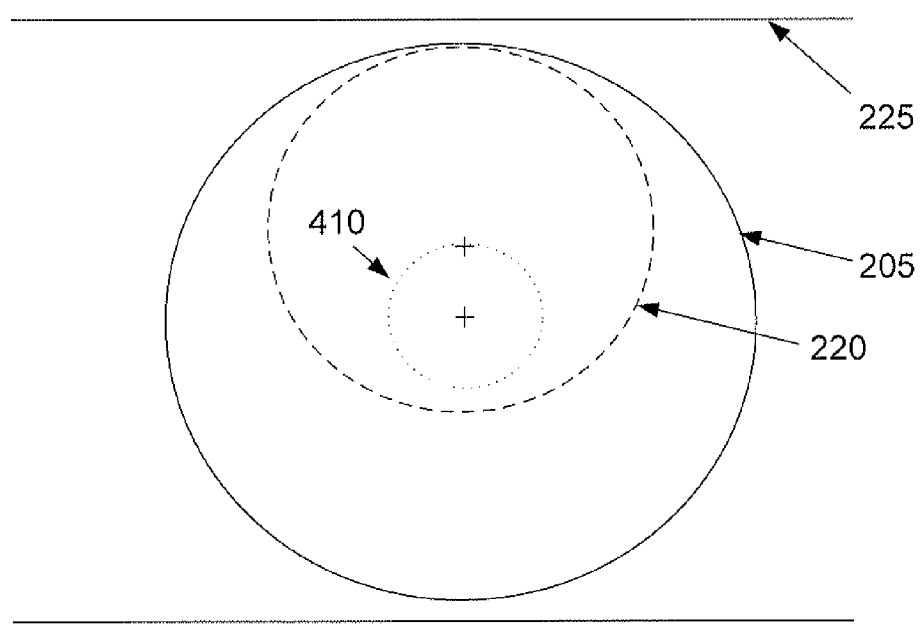
FIG. 5 schematically illustrates a known, circularly shaped pad in which a PTH or via hole is drilled and still being within the manufacturing tolerance.

FIG. 5 schematically illustrates a known, circularly shaped pad 205 in which a PTH or via hole 220 is drilled and still being within the manufacturing tolerance but maximally displaced towards a routing channel. I.e. the centre of the PTH is on the border, or periphery, of the circle showing the manufacturing tolerance 410.

Figure 6A:
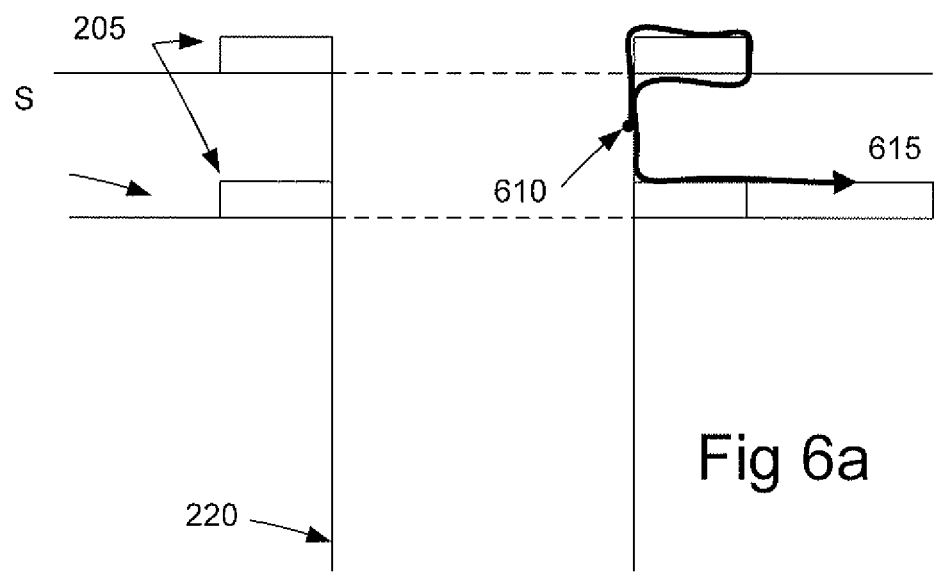
FIG. 6a schematically illustrates a cross section of a prior art PCB and a path travelled by a signal entering a PTH on its inside surface and being transmitted towards a conductive inner layer.

An object of the invention is to provide a PCB having signal layer pads that are construed so that the signal transmission length/distance for high speed interfaces is reduced. For high speed transmission all signals will be transmitted on the outside of a via hole—depending on the so called, skin effect. In a PCB having conventional circular signal layer pads, in order for a signal to pass from the inside of a via to the outside of the via it has to travel over the surface of the outer layer pad; i.e. it cannot protrude through the wall of the via. FIG. 6a schematically illustrates the path 615 travelled by a signal entering a PTH 220 in a PCB in a point 610 on the inside surface of the PTH and being transmitted towards a conductive inner layer S of the PCB. In this figure the PCB is provided with regular circular pads 205, which means that the signal must first travel up to the surface of the PCB, over the upper surface of the pad, around the side of the pad, under the bottom surface of the pad and further down on the outside of the PTH.

Figure 6B:
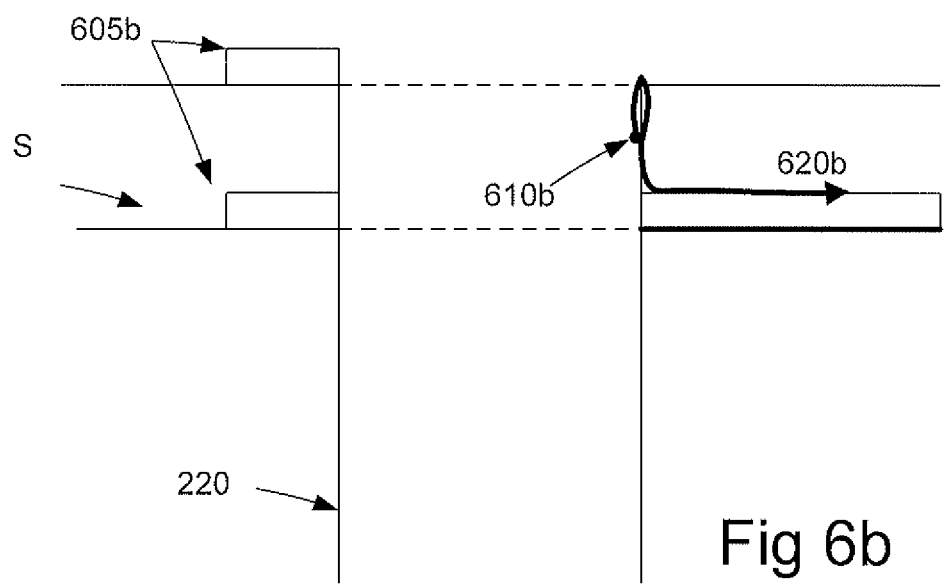
FIG. 6b schematically illustrates a cross section of a PCB according to an embodiment of the invention and a path travelled by a signal entering a PTH on its inside surface and being transmitted towards a conductive inner layer.

FIG. 6b also illustrates the path 620b travelled by a signal entering a via hole 220 in a PCB in a point 610b on the inside surface of the via and being transmitted towards a conductive inner layer S of the PCB. In this figure the PCB is provided with pads 605b according to embodiments of the invention. In this figure a part of the via hole is arranged on the border or on the outside of the pads on the right hand side of the figure. The path that the signal must travel is thus significantly reduced. The signal must first merely travel up to the surface of the PCB and down to the conductive inner layer on the outside of the via, thereby a reduced path will be travelled since no pad must be rounded.

Figure 7:
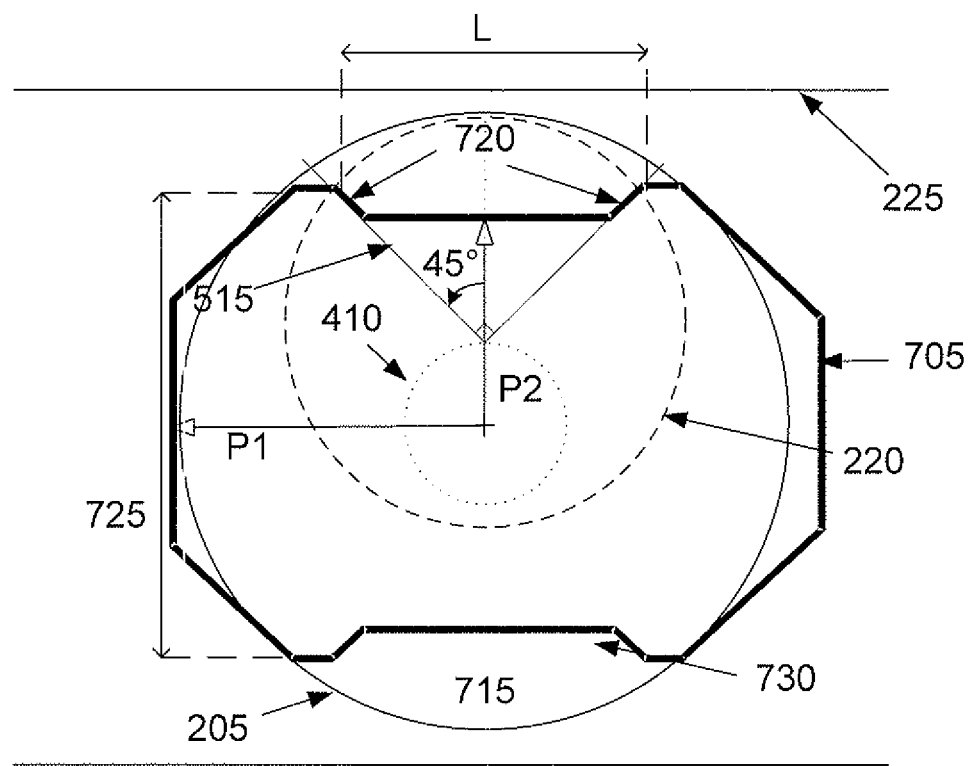
FIG. 7 schematically illustrates a pad shaped in accordance with embodiments of the invention.

FIG. 7 schematically illustrate a pad according to an embodiment of the present invention. Instead of the previously known substantially circularly shaped pad, the pad is provided with different sections comprising straight sides. Compared to a circular pad, the pad is provided with cut-outs or depressions 715 on the sides of the pad that faces the routing channels (the routing channels being parallel to the anti-pads 225). Comparing with a normal pad it is seen as if parts 715 of the pad have been cut out and removed. However, the pad is preferably produced in a manner substantially similar to that of a normal circularly shaped pad.

A first path, P1, stretches from the center of the pad and substantially in a direction in which the routing channel(s) extend, to a point located on the edge of the pad. A second path, P2, stretches from the center of the pad and substantially in a direction towards the routing channel(s) to another point located on the edge of the pad. In this embodiment the length of the path P2 is substantially equal to the radius of the via hole 220 and the via hole having a maximum drilled diameter. The via hole 220 is further maximally displaced in a direction towards the routing channels. As an example the length of path P1 may be 0.45 mm, the length of path P2 may be 0.3 mm and the radius of the PTH may be 0.275 mm. This means that irrespective of where on the pad the PTH is located it will never be more than approximately 5% of the length of the PTH diameter from an edge of the pad. In another example the length of path P1 may be 0.36 mm, the length of path P2 may be 0.24 mm and the radius of the PTH may be 0.2 mm, resulting in that the PTH will never be more than approximately 10% of the length of the PTH diameter from an edge of the pad. The thickness of the PTH wall may be at least approximately 0.025 mm.

Two lines 515 extend from the centre of the via hole 220 and in a perpendicular fashion towards each other. The points where the lines 515, extending from the centre of the via hole 220, intersect the periphery of the via hole 220 indicate, together with criteria that the length of the path P2 is equal to the radius of the via hole, the border for how small the pad is allowed to be. By such a shaping of the pad at most 25% of the circumference of a PTH, being on the border of the manufacturing tolerance 410, is on the outside of the pad, in order to meet quality level according to IPC (Institute for interconnecting and packaging electronic circuits) Class 2 requirements. The parts of the pad provided in the extension direction of the routing channels, i.e. not facing the routing channels, is also angularly shaped. The area of the pad is slightly extended in the extension direction of the routing channels, i.e. on the sides not facing the routing channels. However, one of the sides can be designed to follow a smooth semi-circular contour and not be extended on that side, compared to a normal circularly shaped pad 205, whereas the opposite side may be angularly shaped and slightly extended in order to secure connection to routing channels.

As can be seen in this figure the leaning sides 720 of the further decreased area 730 (being a part of the area 715) i.e. the sides 720 that define the edges of the area 715 in the extension direction of the routing channel, or that define the width of the area, may be leaning with an angle of substantially 45 degrees seen from the centre of the PTH or via 220. Preferably the length L of the depressed area 730 is approximately equal to the radius of the PTH times 42. The PTH or via 220 is provided on the border of the manufacturing tolerance 410 seen in a direction substantially perpendicular towards the direction of the routing channel. As can be seen the distance 725, perpendicular towards the extension direction of the routing channel, is longer than twice the length of the path P2. In this embodiment the distance 725 is equal to 2*(total manufacturing tolerance)+(radius of PTH)*√2.

If the extension direction of the routing channel varies, the relevant extension direction is taken in the point(s) where the routing channel and the pad are in their closest position.

Figure 8:
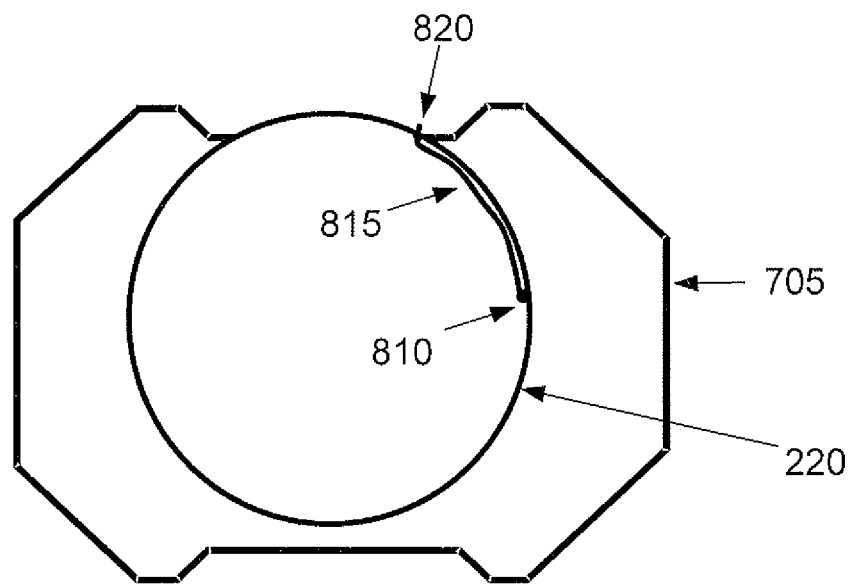
FIG. 8 schematically illustrates a path that a signal, entering a PTH on its inside surface, travels to the outside of the PTH, in accordance with embodiments of the invention.

FIG. 8 schematically illustrates a path 815 that a signal, entering a PTH 220 in a point 810 on its inside surface, travels to the outside of the PTH, in accordance with embodiments of the invention. The signal will seek the shortest path possible to the outside of the PTH. This means that the signal will follow the inside of the PTH towards the point 820 where the PTH 220 and the edge of the pad 705 intersect each other. In case the PTH 220 would not be outside of, or on the edge of, the pad 705, the shortest path would instead be over the upper and lower surfaces as well as the vertical outside surface of the pad. FIG. 8 illustrates a common scenario when signal pins are connected to the PCB using a press-fit technique. Commonly the pins are not connected directly at the surface, but some distance down in the PTH. Pins or connectors may be attached to a PTH (or via) using different techniques, including press-fit, soldering, compression and pin-in-paste.

A capacitance that creates reflections in the transmission line is depending on the distance between an edge of a pad and an edge of an anti-pad in an adjacent ground plane. The size of the routing channel for passing transmission lines through a connector foot-print is also depending on the pad and anti-pad dimensions. The size of the routing channel is also affecting the choice of the trace width of the routing channels which in turn is affecting the attenuation of the transmission line. As system bit rates and signal density are increasing the routing channel through the connector foot-prints are a bottleneck when considering high electrical performance and cost effective solutions. Since the capacitance is dependent on the distance between the pad and the anti-pad positioned in an adjacent layer of the PCB, the capacitance, when pads designed in accordance with FIGS. 7 and 8, will be lower than the corresponding capacitance for a circularly shaped pad. However, the designer of the PCB may instead of lowering the capacitance use the extra space to extend the width of the routing channels, leading to no changes to the capacitance.

The routing channels need to be wide enough to handle a specified signal performance and manufacturing tolerances of the PCB. The routing channel is e.g. depending on; connector foot-print depending on connector design, layer-to-layer mis-registration tolerance in PCB production, tolerance of hole drill position in PCB production, size of the drilled hole depending on connector design, clearance between copper areas to achieve best yield in PCB production and size of the pad in order to meet quality level according to IPC requirements. For an optimum electrical performance the routing channel need to consider e.g.; the physical structure of the signal interface (trace width & trace separation), capacitance allowed between via hole pad and adjacent ground layers, ground coverage in adjacent layers and minimum clearance between via hole and traces to avoid life time dependent failure modes for PCBs.

Figure 9:
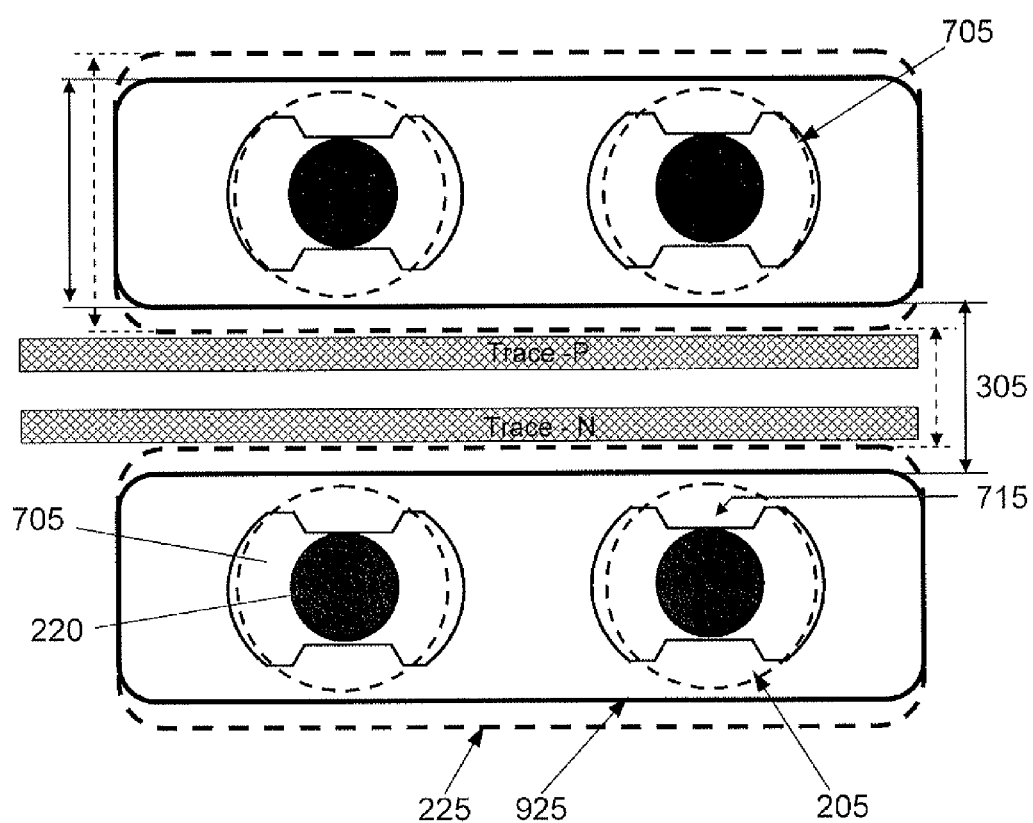
FIG. 9 schematically illustrates a part of a layer of a PCB in accordance with an embodiment of the invention, showing four pads, each with a PTH, and a routing channel, and anti-pads provided in an adjacent layer.

FIG. 9 schematically illustrates a part of a layer of a PCB in accordance with an embodiment of the invention, showing four pads 705, each with a PTH 220, and a routing channel 305, and anti-pads 925 provided in an adjacent layer. As can be seen from the figure the pads are provided with sides with at least one area 715, on the sides facing the routing channel, where copper has been cut-out compared to a circular pad 205. By designing the pads 705 as shown in the figure, the anti-pads 925 can be made smaller (less wide) which result in that the routing channels can be made larger (wider). Previous designs are illustrated with dashed lines including a circularly shaped pad 205, wide anti-pads 225 and narrow routing channels 305. In this embodiment the pads are also slightly extended in the extension directions of the routing channel. A reason for extending the pads in the extension direction of the routing channel may be to make it easier to make connections between the pads and the routing channels. By changing the design of the pad by having less copper between the centre of the pad and the routing channel, in a direction substantially perpendicular to the extension direction of the routing channels, the capacitance between the pad and anti-pads in adjacent ground layers will be reduced. The length of this area, seen in the extension direction of the routing channels could be approximately between 50-75% of the diameter of the PTH or via. Preferably, the length L (see FIG. 7) is approximately 1/√2 times the diameter of the PTH. The width of this area could be approximately between 10-15% of the diameter of the PTH or via. Previous designs are illustrated with dashed lines including a circularly shaped pad 205, wide anti-pads 225 and narrow routing channels 305. The final shape of the pads 705 can comprise smooth outer edges as shown in FIG. 9 and/or several segments with specified length as shown in FIG. 7. The periphery may thus be angularly shaped and/or have smooth transitions between different sections of the periphery.

The size of a pad may be dependent on the size of the via hole or PTH that will be drilled through the pad and also on PCB manufacturing tolerances.

By cutting the pads at both sides and/or by providing cut outs or depressions as mentioned in the embodiments above an increased width for the routing channels may be accomplished. Increased widths of routing channels make it possible to secure ground coverage underneath the signal traces in adjacent layers, which may result in reduced crosstalk and reduced impedance variations. Resonances depending on periodic discontinuities may also be avoided. Wider routing channels may result in wider traces, which in turn result in less insertion loss and less variation of the impedance depending on manufacturing tolerances regarding trace width. Further, wider routing channels may allow increased manufacturing tolerances in PCB production resulting in lower cost.

By cutting the pads at both sides and/or by providing cut outs or depressions as mentioned in the embodiments above, the distance between the edge of a pad and the corresponding edge of an anti-pad arranged in adjacent ground layer may increase, resulting in a reduced capacitance between the layers. Reduced capacitance between pads and anti-pads in adjacent ground layers may result in improved signal performance of the interconnection, depending on reduced discontinuities and an improved return loss.

With a balance between the advantages above an increased signal performance can be combined with reduced cost and still meet the quality requirements according to IPC.

Figure 10:
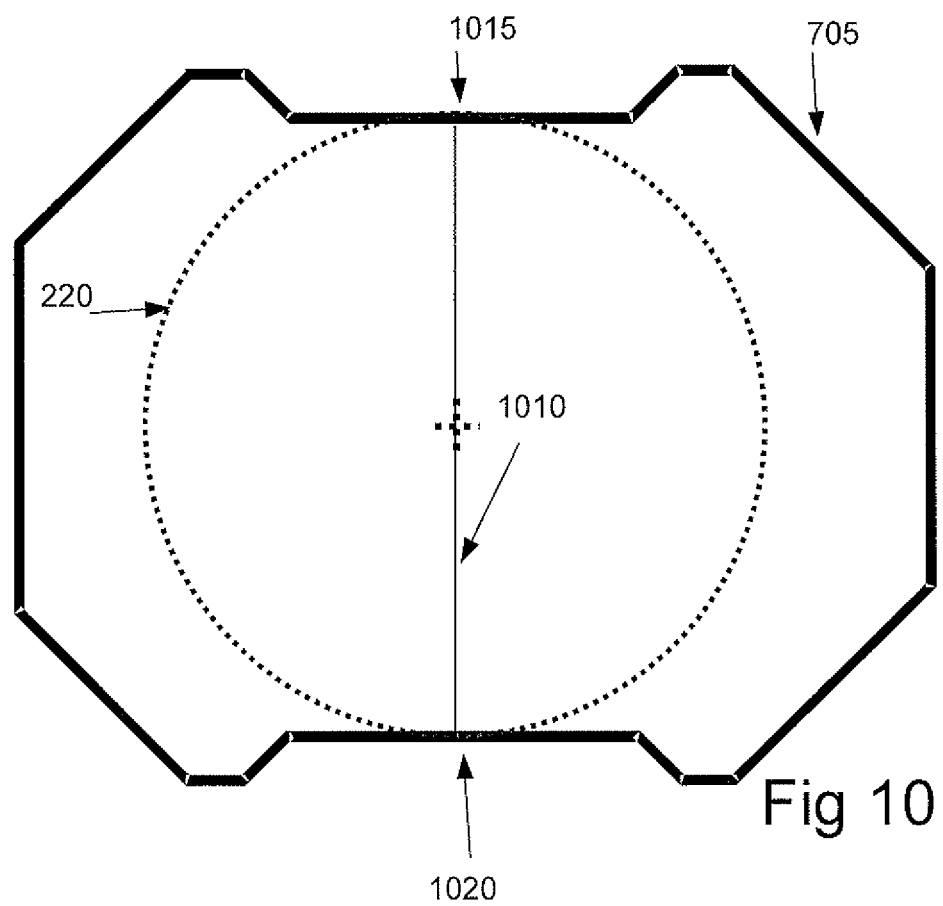
FIGS. 10-15 schematically illustrates examples of how pads according to embodiments of the invention can be shaped.

FIG. 10 schematically illustrates an example of how a pad 705 according to an embodiment of the invention can be shaped. As can be seen from the figure the distance of a path 1010 between a first point 1015 on the upper part of the pad and a second point 1020 on the lower part of the pad is substantially equal to the diameter of the PTH 220. The path is passing through the centre of the pad and a PTH that has been drilled with its centre exactly coinciding with the centre of the pad. In accordance with embodiments of the invention there should always be a path between two points on the pad, arranged on opposite sides of the pad, that have a distance that is substantially equal to or slightly larger than the diameter of the PTH, thereby the PTH will be in close proximity to the edge of the pad irrespective of where on the pad the centre of the PTH is positioned. Preferably the path 1010 is substantially equal to the drill diameter plus the drilled hole diameter tolerance. The distance of path 1010 may be slightly longer, but preferably not more than 10% longer, than the diameter of the PTH. The wording "slightly larger" or "slightly longer" should thus be understood to mean between 0-10% larger/longer. In some embodiments the hole diameter tolerance may be equal to approximately 10% of the drill diameter.

Figure 11:
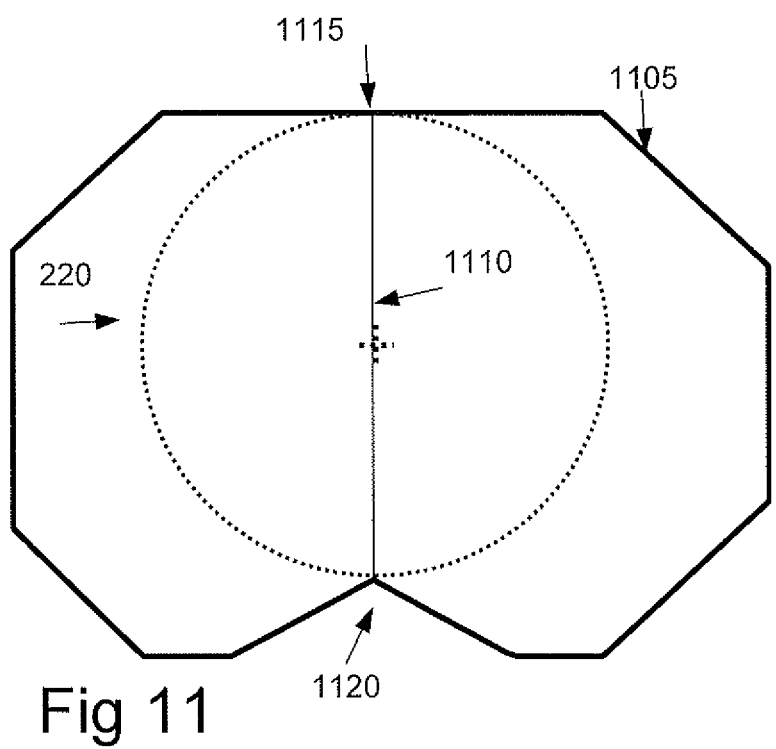

FIG. 11 schematically illustrates an example of how a pad 1105 according to an embodiment of the invention can be shaped. As can be seen from the figure the distance of a path 1110 between a first point 1115 on the upper part of the pad and a second point 1120 on the lower part of the pad is substantially equal to or slightly larger than the diameter of the PTH 220.

Figure 12:
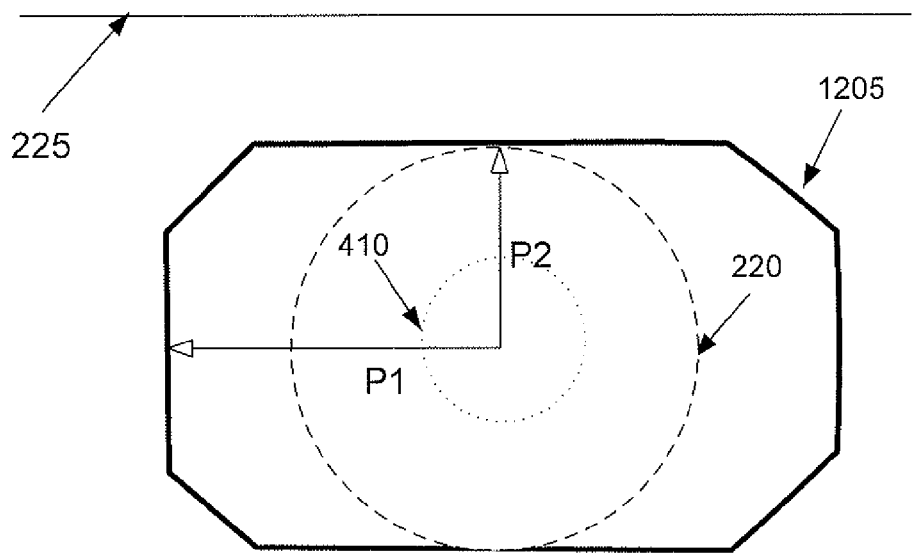

FIG. 12 schematically illustrates an example of how a pad according to an embodiment of the invention can be shaped. As can be seen from the figure the width of the pad 1205 is substantially equal to the diameter of the via hole 220. A slight displacement of the via hole 220 in any direction, except parallel to the routing channel, would cause the via hole to be outside of the pad. No displacement of the via hole that is within the manufacturing tolerance 410 will however result in that more than 50% of the via hole is outside of the pad. Further, the via hole will not be outside of the pad in two different regions. Therefore, the pad 1205 fulfils the requirement of IPC Class 1. By having very high demands on the manufacturing tolerance, i.e. a small area 410 in which the centre of the via hole is allowed to be placed, the pad 1205 can also fulfil requirement of IPC Class 2.

Figure 13:
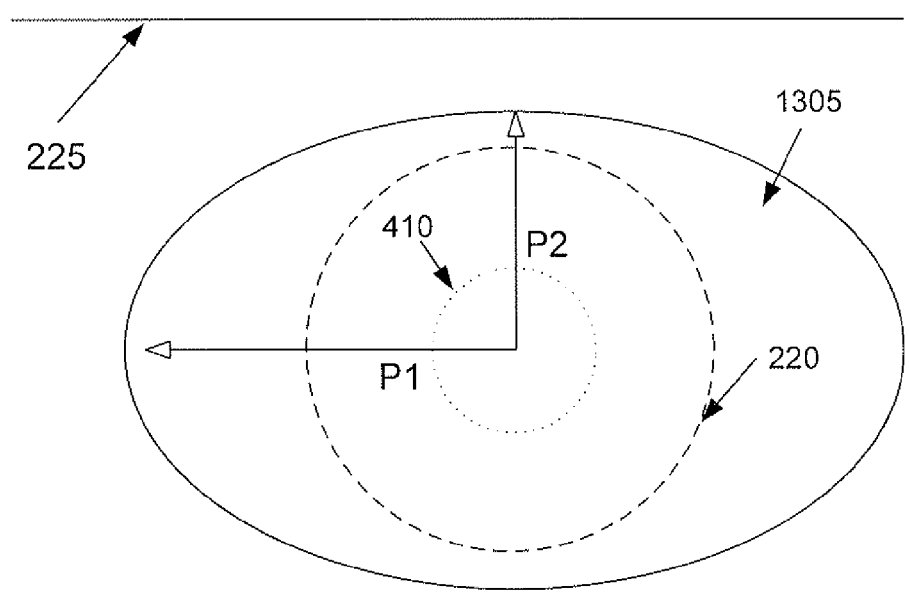

FIG. 13 schematically illustrates an example of how a pad according to an embodiment of the invention can be shaped. As can be seen from the figure the width of the pad 1305 is, in its widest place, slightly larger than the diameter of the via hole 220. A slight displacement of the via hole 220 in any direction, except parallel to the routing channel, would cause the via hole to be outside of the pad. No displacement of the via hole that is within the manufacturing tolerance 410 will however result in that more than 50% of the via hole is outside of the pad. Further, the via hole will not be outside of the pad in two separate regions. Therefore, the pad 1305 fulfils the requirement of IPC Class 1. By having very high demands on the manufacturing tolerance, i.e. a small area 410 in which the centre of the via hole is allowed to be placed, the pad 1305 can also fulfil requirement of IPC Class 2.

Figure 14:
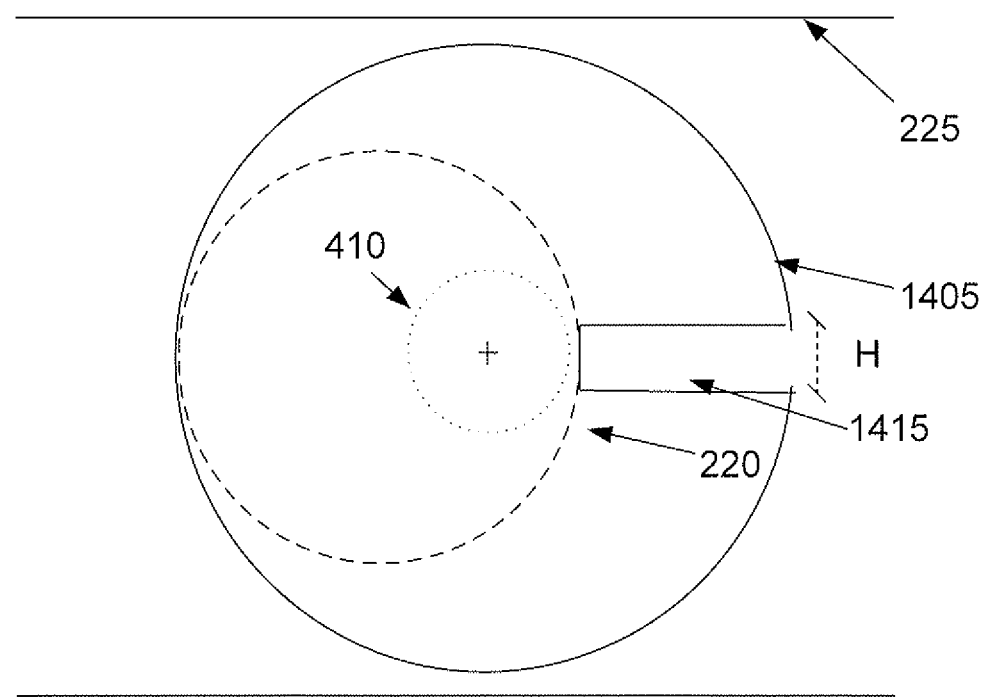

FIG. 14 schematically illustrates an example of how a pad 1405 according to an alternative embodiment of the invention can be shaped. By configuring the pads in accordance with this figure some of the advantages with previously described embodiments may not be achieved, e.g. reduced capacitance and/or widened routing channels. However, by configuring the pads in accordance with these figures the advantage described with reference to FIG. 6b will be accomplished, since a part of the PTH will always be in proximity to, or on the outside of the pad no matter how the PTH is placed on the pad. Preferably the pads are constructed such that only one continuous part of the PTH is on the outside of each pad, irrespective of where the PTH is drilled, and the centre of the PTH is preferably positioned within the manufacturing tolerance 410. The pad 1405 is provided with a cut-out 1415, having a depth that is longer than, approximately equal to, or slightly shorter than, the diameter of the pad minus the diameter of the PTH. However, it is preferably not longer than the diameter of the via hole. The height H of the cut-out may vary, but it should preferably be large enough to avoid solder bridges. However, the height H may be limited by IPC requirements.

Figure 15:
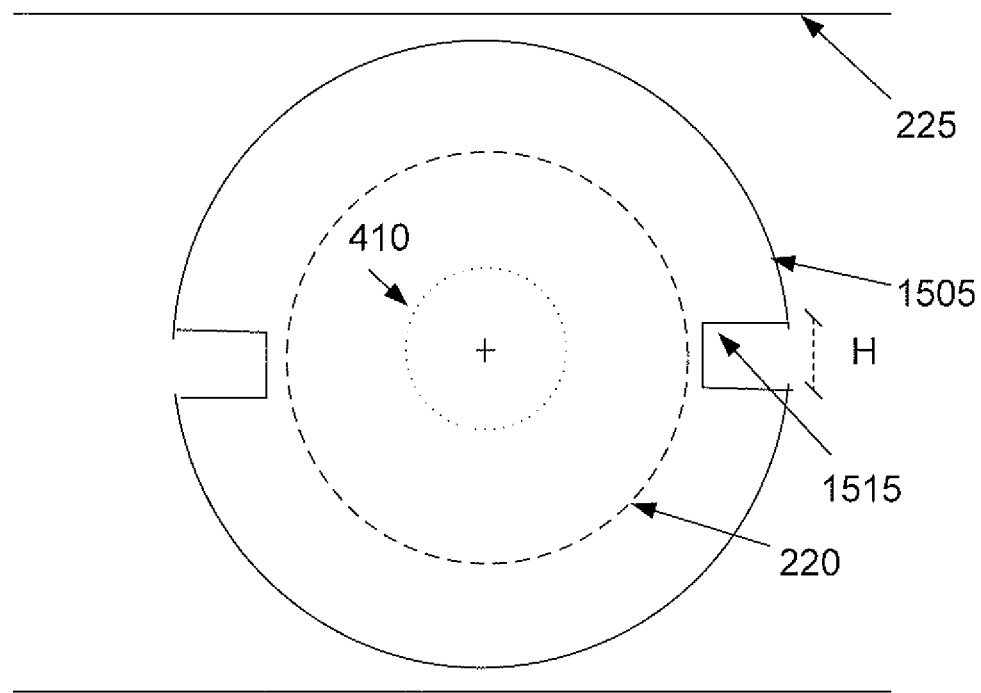

FIG. 15 schematically illustrates an example of how a pad 1505 according to an alternative embodiment of the invention can be shaped. The pad 1505 is provided with two cut-outs 1515, provided at opposite sides of the pad. The sum of the depths of the two cut-outs 1515 is approximately equal to, or slightly smaller than, the diameter of the pad minus the diameter of the PTH. . The height H of the cut-out may vary, but it should preferably be large enough to avoid solder bridges. However, the height H may be limited by IPC requirements.

According to some embodiments of the present invention a printed circuit board (PCB) is provided. The PCB comprises a number of conductive layers comprising routing channels, at least one ground layer and a number of plated through holes (can also be via holes) connecting adjacent layers of the PCB. The plated through hole is surrounded by pads in the conductive layers and by anti-pads in the ground layer(s). The pads that are surrounding the plated through holes in the conductive layers of the PCB have a shape such that a plated through hole is always on the outside of or, on the edge of, or in proximity to the edge of, the pad in at least one point.

The present invention may of course, be carried out in other specific ways than those herein set forth without departing from the essential characteristics of the invention. The present embodiments are, therefore, to be considered in all respects as illustrative and not restrictive and all changes coming within the meaning and equivalency range of the appended claims are intended to be embraced therein.

The invention claimed is:

1. A Printed circuit board, PCB, comprising:
a number of signal layers comprising routing channels;
at least one ground layer being adjacent to at least one of the signal layers; and
a number of via holes connecting different signal layers of the PCB, the via holes being connected to pads in the signal layers and surrounded by anti-pads in the at least one ground layer;
at least one of the pads being shaped such that at least a part of a via hole connected to the at least one pad is on the outside of, or in close proximity to, an edge of the at least one pad, irrespective of where on the at least one pad the centre of the via hole connected to the at least one pad is positioned,
wherein at least a portion of the via hole connected to the at least one pad overlaps a center of the at least one pad.

2. The PCB according to claim 1, wherein the one or more pads are shaped such that the length of a first path, stretching from the center of the one or more pads and substantially in a direction in which routing channel(s) extend, to a first point located on an edge of the one or more pads, is different from the length of a second path, stretching from the center of the one or more pads and substantially in a direction towards the routing channel(s) to a second point located on the edge of the one or more pads.

3. The according to claim 2, wherein the first path (P1) is longer than the second path (P2).

4. The PCB according to claim 1, wherein the second path (P2) is approximately equal to, or slightly larger than, the radius of the via hole.

5. The PCB according to claim 1, wherein the second path (P2) is approximately equal to a maximum drilled hole radius.

6. The PCB according to claim 1, wherein the one or more pads are designed so that one or more sides that face a routing channel make up a straight line for a certain distance.

7. The PCB according to claim 1, wherein the one or more pads are provided with at least one cut-out or depression.

8. The PCB according to claim 7, wherein the at least one cut-out or depression is provided on one or more sides that face a routing channel.

9. The PCB according to claim 1 wherein a path between two points on the one or more pads, the points being arranged on opposite sides of the one or more pads, have a distance that is substantially equal to or slightly longer than the diameter of the via hole.

10. The PCB according to claim 1 wherein the one or more pads are arranged in an outer layer.

11. The PCB according to claim 1, wherein the one or more pads are arranged in inner signal layers (S) and the one or more pads are arranged in outer layers.

12. The PCB according to claim 1, wherein the one or more pads are shaped such that only one continuous part of the via hole(s) is on the outside of the one or more pads, irrespective of where, within the manufacturing tolerance, on the pads the centre of the via hole(s) is/are positioned.

13. A Printed circuit board, PCB, comprising:
a number of signal layers comprising routing channels;
at least one ground layer being adjacent to at least one of the signal layers; and
a number of via holes connecting different signal layers of the PCB, the via holes being connected to pads in the signal layers and surrounded by anti-pads in the at least one ground layer;
at least one of the pads being shaped such that at least a part of a circumference of a via hole connected to the at least one pad is on the outside of an edge of the at least one pad, irrespective of where on the at least one pad the centre of the via hole is positioned,
wherein the at least a part of the via hole circumference that is outside of the edge of the at least one pad is no more than a quarter of the via hole circumference.

* * * * *

UNITED STATES PATENT AND TRADEMARK OFFICE
CERTIFICATE OF CORRECTION

| | | |
|---|---|---|
| PATENT NO. | : 8,963,018 B2 | Page 1 of 1 |
| APPLICATION NO. | : 13/501954 | |
| DATED | : February 24, 2015 | |
| INVENTOR(S) | : Olsen | |

It is certified that error appears in the above-identified patent and that said Letters Patent is hereby corrected as shown below:

On the title page, item 57, under "ABSTRACT", in Column 2, Line 7, delete "be surrounded" and insert -- surrounded --, therefor.

In the specification

In Column 5, Line 35, delete "42." and insert -- $\sqrt{2}$. --, therefor.

In the claims

In Column 9, Line 28, in Claim 3, delete "The according" and insert -- The PCB according --, therefor.

Signed and Sealed this
Twentieth Day of October, 2015

Michelle K. Lee
*Director of the United States Patent and Trademark Office*